United States Patent
Kim et al.

(10) Patent No.: US 9,154,110 B2
(45) Date of Patent: Oct. 6, 2015

(54) RADIO FREQUENCY (RF) FILTER AND RF TRANSCEIVER USING BULK ACOUSTIC WAVE RESONATOR (BAWR)

(71) Applicant: Samsung Electronics Co., Ltd., Suwon-si (KR)

(72) Inventors: Duck Hwan Kim, Goyang-si (KR); Chul Soo Kim, Hwaseong-si (KR); Seong Joong Kim, Suwon-si (KR); In Sang Song, Osan-si (KR); Jea Shik Shin, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 174 days.

(21) Appl. No.: 13/747,594

(22) Filed: Jan. 23, 2013

(65) Prior Publication Data

US 2013/0249643 A1    Sep. 26, 2013

(30) Foreign Application Priority Data

Mar. 23, 2012 (KR) .................. 10-2012-0030190

(51) Int. Cl.
| | |
|---|---|
| H01L 41/00 | (2013.01) |
| H03H 9/54 | (2006.01) |
| H03H 9/02 | (2006.01) |
| H03H 9/17 | (2006.01) |
| H03H 9/60 | (2006.01) |

(52) U.S. Cl.
CPC ............. *H03H 9/54* (2013.01); *H03H 9/02834* (2013.01); *H03H 9/173* (2013.01); *H03H 9/605* (2013.01)

(58) Field of Classification Search
USPC .......... 333/133, 189, 187, 190, 195, 186, 100
See application file for complete search history.

(56) References Cited

U.S. PATENT DOCUMENTS

| | | | |
|---|---|---|---|
| 7,276,994 B2 * | 10/2007 | Takeuchi et al. .............. 333/189 |
| 7,741,931 B2 * | 6/2010 | Matsuda et al. .............. 333/133 |
| 2001/0052739 A1 | 12/2001 | Milsom | |
| 2004/0092234 A1 | 5/2004 | Pohjonen | |
| 2006/0001329 A1 | 1/2006 | Rao et al. | |
| 2007/0120625 A1 * | 5/2007 | Larson et al. ................. 333/189 |
| 2009/0153268 A1 | 6/2009 | Milsom et al. | |
| 2011/0032053 A1 * | 2/2011 | Park et al. ..................... 333/189 |

FOREIGN PATENT DOCUMENTS

| | | |
|---|---|---|
| KR | 10-2000-0062574 A | 10/2000 |
| KR | 10-2005-0109174 A | 11/2005 |
| KR | 10-2008-0023652 A | 3/2008 |

(Continued)

OTHER PUBLICATIONS

International Search Report issued May 16, 2013 in counterpart International Application No. PCT/KR2013/001104 (3 pages, in English).

*Primary Examiner* — Lincoln Donovan
*Assistant Examiner* — Thomas Skibinski
(74) *Attorney, Agent, or Firm* — NSIP Law (57) ABSTRACT

A filter and a transceiver in a radio frequency (RF) band, using a bulk acoustic wave resonator (BAWR), are provided. The RF filter includes at least one low temperature coefficient of frequency (TCF) BAWR. The RF filter further includes at least one high quality factor (Q) BAWR including a high Q compared to the at least one low TCF BAWR, the at least one low TCF BAWR including a low TCF compared to the at least one high Q BAWR.

20 Claims, 8 Drawing Sheets

(56) References Cited

FOREIGN PATENT DOCUMENTS

| KR | 10-2008-0024451 A | 3/2008 |
| KR | 10-2008-0096801 A | 11/2008 |
| KR | 10-2010-0082541 A | 7/2010 |
| KR | 10-2012-0009602 A | 2/2012 |

* cited by examiner

RADIO FREQUENCY (RF) FILTER AND RF TRANSCEIVER USING BULK ACOUSTIC WAVE RESONATOR (BAWR)

CROSS-REFERENCE TO RELATED APPLICATION(S)

This application claims the benefit under 35 U.S.C. §119 (a) of Korean Patent Application No. 10-2012-0030190, filed on Mar. 23, 2012, in the Korean Intellectual Property Office, the entire disclosure of which is incorporated herein by reference for all purposes.

BACKGROUND

1. Field

The following description relates to a filter and a transceiver in a radio frequency (RF) domain using a bulk acoustic wave resonator (BAWR).

2. Description of Related Art

A bulk acoustic wave resonator (BAWR) may be used in a signal transfer system using a wireless scheme. In addition, the BAWR may be used for input and output of wireless data.

There are various types of wireless communication device for various purposes, and the number of wireless devices, conventionally regarded as wired devices, has increased rapidly. Accordingly, there is a need for a radio frequency (RF) device capable of securing low power and rapid characteristics.

SUMMARY

In one general aspect, there is provided a radio frequency (RF) filter using a bulk acoustic wave resonator (BAWR), the RF filter including at least one low temperature coefficient of frequency (TCF) BAWR. The RF filter further includes at least one high quality factor (Q) BAWR including a high Q compared to the at least one low TCF BAWR, the at least one low TCF BAWR including a low TCF compared to the at least one high Q BAWR.

In another general aspect, there is provided a radio frequency (RF) transceiver using a bulk acoustic wave resonator (BAWR), the RF transceiver including a first filter configured to filter a signal to be transmitted in a transmission frequency band. The RF transceiver further includes a second filter configured to filter a signal received in a reception frequency band. The first filter and the second filter are configured to operate at different predetermined resonant frequencies, respectively. Each of the first filter and the second filter includes at least one low temperature coefficient of frequency (TCF) BAWR, and at least one high quality factor (Q) BAWR including a high Q compared to the at least one low TCF BAWR, the at least one low TCF BAWR including a low TCF compared to the at least one high Q BAWR.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, description of well-known functions and constructions may be omitted for increased clarity and conciseness.

It is understood that the features of the disclosure may be embodied in different forms and should not be constructed as limited to the example(s) set forth herein. Rather, example(s) are provided so that this disclosure will be thorough and complete, and will convey the full scope of the disclosure to those skilled in the art. The drawings may not be necessarily to scale, and, in some instances, proportions may have been exaggerated in order to clearly illustrate features of the example(s). When a first layer is referred to as being "on" a second layer or "on" a substrate, it may not only refer to a case where the first layer is formed directly on the second layer or the substrate but may also refer to a case where a third layer exists between the first layer and the second layer or the substrate.

Due to the limited number of frequency resources, companies operating a mobile communication system have suffered significant costs for allocation of frequencies to be used for communication. For example, to prevent interference from occurring among transmitted and received signals of a mobile communication device, a predetermined band gap may be needed between a transmission frequency band and a reception frequency band of the mobile communication device. However, bandwidth needs have increased due to an increasing amount and an increasing rate of data transmission. Accordingly, the companies have been forced to reduce the band gap between the transmission frequency band and the reception frequency band in order to efficiently use the frequency resources. A resonator including a high Q value may be needed to reduce the band gap in an RF communication system.

A bulk acoustic wave resonator (BAWR) is an apparatus that generates a predetermined frequency wave or oscillation, using a resonance phenomenon, and may be included as a portion of an RF apparatus, such as a filter and an oscillator. In more detail, the BAWR induces a resonance using a vertical acoustic wave to electrically utilize the resonance. The BAWR of a radio frequency (RF) filter and an RF transceiver may include electrodes that are disposed on and below, respectively, a piezoelectric layer. When the piezoelectric layer oscillates in response to a high frequency electric potential applied to the upper and lower electrodes, the BAWR operates as a filter. The BAWR may be separated from a substrate through an air cavity in order to enhance a reflective characteristic of the vertical acoustic wave occurring in the BAWR and to minimize loss of the vertical acoustic wave. The BAWR may further include a reflective layer in which reflection films are alternately evaporated, as a reflector to further minimize the loss of the vertical acoustic wave.

Figure 1:
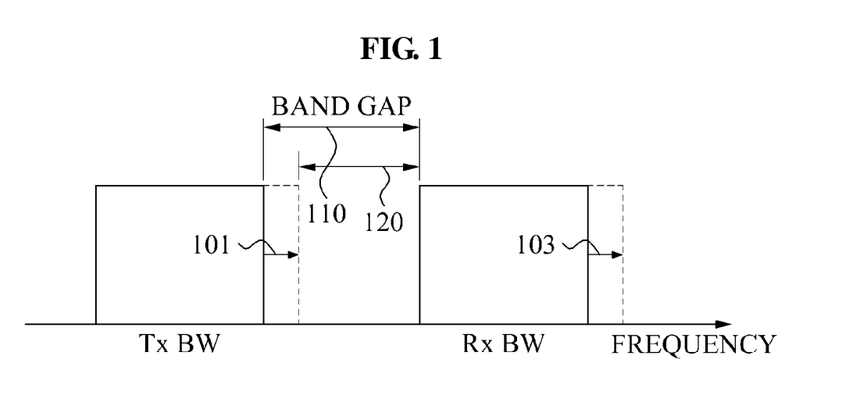
FIG. 1 is a diagram illustrating an example of a band gap between a transmission frequency band and a reception frequency band of a mobile communication device.

FIG. 1 is a diagram illustrating an example of a band gap between a transmission frequency band and a reception frequency band of a mobile communication device. A number of frequency resources usable by mobile communication devices is limited. Accordingly, each of the mobile communication devices may perform communication using an allocated frequency band. To prevent interference from occurring among transmitted and received signals of a mobile communication device, a predetermined band gap may be needed between a transmission frequency band used for transmission of a signal and a reception frequency band used for reception of a signal. A method of reducing the band gap to secure a larger frequency band than the allocated frequency band may be used if an amount of data to be transmitted and received to and from the mobile communication device is increased. To apply the above method, there is a need for an apparatus that may perform communication without interference among transmitted and received signals even in a narrow band gap.

Referring to FIG. 1, in response to requirements of communication providers, the transmission frequency band (Tx BW) is increasing (101) and the reception frequency band (Rx BW) is also increasing (103). Due to the increase (101) in the transmission frequency band, a band gap 110 between the transmission frequency band the reception frequency band is reduced to a narrow band gap 120.

A duplexer of the mobile communication device that separates a transmitted signal and a received signal (e.g., determines whether an input signal is a transmitted signal or a received signal) may be configured using a BAWR. In more detail, a BAWR including a high quality factor and a BAWR including a low temperature coefficient of frequency (TCF) may accurately and efficiently separate a transmitted signal and a received signal in the narrow band gap 120. The TCF of the BAWR indicates a change amount of frequency in a temperature range used by the BAWR, and indicates that the change amount of frequency based on a temperature change is small as a ratio of the change amount of frequency to the temperature change becomes closer to zero.

Figure 2:
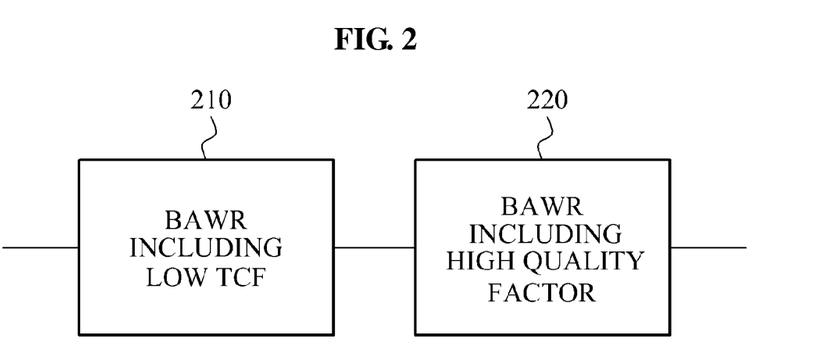
FIG. 2 is a block diagram illustrating an example of a radio frequency (RF) filter using a bulk acoustic wave resonator (BAWR).

FIG. 2 is a block diagram illustrating an example of an RF filter using a BAWR. Referring to FIG. 2, the RF filter includes a BAWR 210 and a BAWR 220.

The BAWR 210 includes a low TCF compared to the BAWR 220. The BAWR 210 may include an upper electrode, a lower electrode, and a piezoelectric layer disposed between the upper electrode and the lower electrode. Materials that form the upper electrode, the lower electrode, and the piezoelectric layer may include a negative (−) value of TCF. When a TCF compensation layer including a positive (+) value of TCF is added to the BAWR 210, a device including the BAWR 210 may operate in a narrow band gap as the TCF of the BAWR 210 becomes closer to zero.

The BAWR 220 includes a high quality factor compared to the BAWR 210. The quality factor is also referred to as a Q-value, and indicates an electrical characteristic of a device. For example, filtering of a predetermined frequency may become more precise based on an increase in the quality factor.

The BAWR 220 may include the structure of the BAWR 210, except that the TCF compensation layer is omitted. With respect to the BAWR 210, when a thickness of the BAWR 210 increases by adding the TCF compensation layer to the upper electrode, the lower electrode, and the piezoelectric layer, the quality factor of the BAWR 210 decreases. That is, the quality factor of the BAWR 210 is inversely proportional to the thickness of the BAWR 210. Accordingly, the BAWR 220 in which the TCF compensation layer is omitted includes the quality factor higher than the that of the BAWR 210.

Since a thickness of an edge area of the upper electrode is transformed in the BAWR 220, the BAWR 220 includes the high quality factor. This is because, when the thickness of the edge area is transformed, an impedance of the edge area is also transformed, and thus, an acoustic wave of a resonant frequency occurring in the piezoelectric layer is not lost to an outside of the piezoelectric layer.

Figure 3:
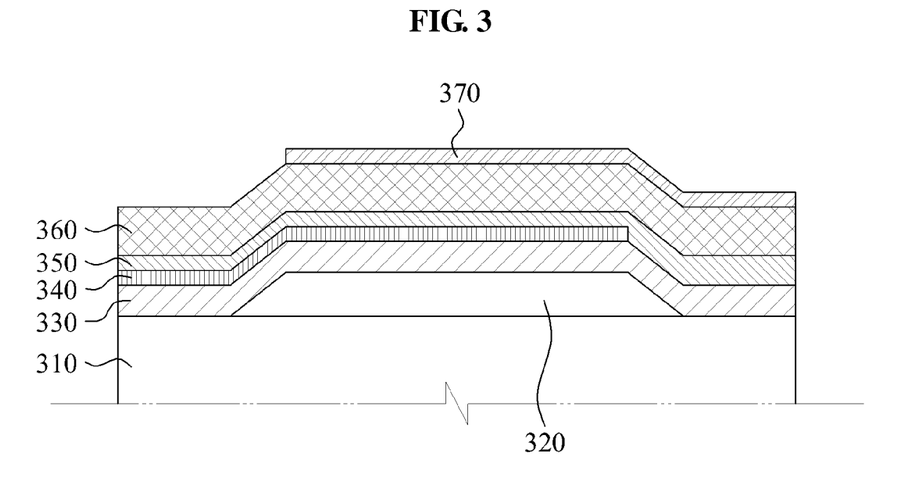
FIG. 3 is a cross-sectional view illustrating an example of a BAWR including a low temperature coefficient of frequency (TCF).

FIG. 3 is a diagram illustrating a cross-sectional view of an example of a BAWR including a low TCF. Referring to FIG. 3, the BAWR includes a first electrode 340, a piezoelectric layer 360, and a second electrode 370. The BAWR is disposed on an air cavity 320. The air cavity 320 may reflect a vertical acoustic wave occurring in the BAWR.

The air cavity 320 is disposed above a substrate 310. The air cavity 320 may be formed by disposing a sacrificial layer (not shown) on the substrate 310 and by patterning and etching the sacrificial layer. The substrate 310 may include a silicon type or a silicon on insulator (SOI) type. A membrane 330 is disposed on the air cavity 320 to maintain a shape of the air cavity 320.

The first electrode 340 is disposed on the membrane 330. A TCF compensation layer 350 may be disposed on the first electrode 340. The piezoelectric layer 360 may be disposed on the TCF compensation layer 350. The second electrode 370 may be disposed on the piezoelectric layer 360. Each of the first electrode 340 and the second electrode 370 may include a material, for example, gold, molybdenum (Mo), ruthenium (Ru), aluminum (Al), platinum (Pt), titanium (Ti), tungsten (W), palladium (Pd), chromium (Cr), nickel (Ni), and/or other suitable materials known to one of ordinary skill in the art. The piezoelectric layer 360 may include a material, for example, zinc oxide (ZnO), aluminum nitride (AlN), and/or other suitable materials known to one of ordinary skill in the art. The TCF compensation layer 350 may include a silicon oxide-based material, a silicon nitride-based material, and/or an aluminum nitride-based material.

The materials that form the first electrode 340, the piezoelectric layer 360, and the second electrode 370 includes a negative value of TCF. Accordingly, to make the TCF of the BAWR become close to zero, the material that forms the TCF compensation layer 350 includes a positive value of TCF.

The positive value of TCF of the TCF compensation layer 350 may be further increased by doping the silicon oxide-based material, the silicon nitride-based material, and/or the aluminum nitride-based material, with an impurity element. In this example, the impurity element may include arsenic (As), antimony (Sb), phosphorus (P), boron (B), germanium (Ge), silicon (Si), and/or aluminum (Al).

The TCF compensation layer 350 may be disposed on or below the piezoelectric layer 360, and may also be disposed on and below the piezoelectric layer 360.

The BAWR 210 of FIG. 2 may include the structure of FIG. 3. In this example, the BAWR 210 includes the TCF compensation layer 350.

The BAWR 220 of FIG. 2 may include the structure of FIG. 3, except that the TCF compensation layer 350 is omitted. Additionally, the BAWR 220 may include an air edge formed by etching a predetermined area of the first electrode 340, the piezoelectric layer 360, and the second electrode 370. The air edge may reflect a horizontal component of a resonant frequency occurring in the piezoelectric layer 360 to prevent loss of the horizontal component to an outside of the piezoelectric layer 360, and thus, a quality factor of the BAWR 220 may be enhanced.

Also, the BAWR 220 of FIG. 2 may include a reflective layer (not shown) disposed below the first electrode 340, on the second electrode 370, or below the first electrode 340 and on the second electrode 370. The reflective layer may reflect a vertical component of the resonant frequency occurring in the piezoelectric layer 360 to prevent loss of the vertical component to an outside of the piezoelectric layer 360, and thus, the quality factor of the BAWR 220 may be enhanced.

FIG. 4 through FIG. 13 are diagrams illustrating examples of an RF filter using a BAWR. In more detail, FIG. 4 through FIG. 13 are circuit diagrams illustrating examples that may include the BAWR 210 and the BAWR 220 of FIG. 2.

In the following descriptions, the BAWR 210 is referred to as a low TCF BAWR, and the BAWR 220 is referred to as a high Q BAWR. An RF filter includes an asymmetric characteristic. A low frequency band of a pass band of the RF filter may include a high attenuation characteristic, and a high frequency band of the pass band may include a characteristic of relatively relieving the high attenuation characteristic. Alternatively, the high frequency band of the pass band may include the high attenuation characteristic, and the low frequency band of the pass band may require the characteristic of relatively relieving the high attenuation characteristic.

The low TCF BAWR including a relatively low TCF characteristic may be used for a frequency band of the pass band that includes the high attenuation characteristic. The high Q BAWR may be used for a frequency band of the pass band that relatively relieves the high attenuation characteristic. By combining the low TCF BAWR and the high Q BAWR, the RF filter may achieve a low insertion loss characteristic compared to an RF filter that is configured as a unit type of a resonator.

Figure 4:
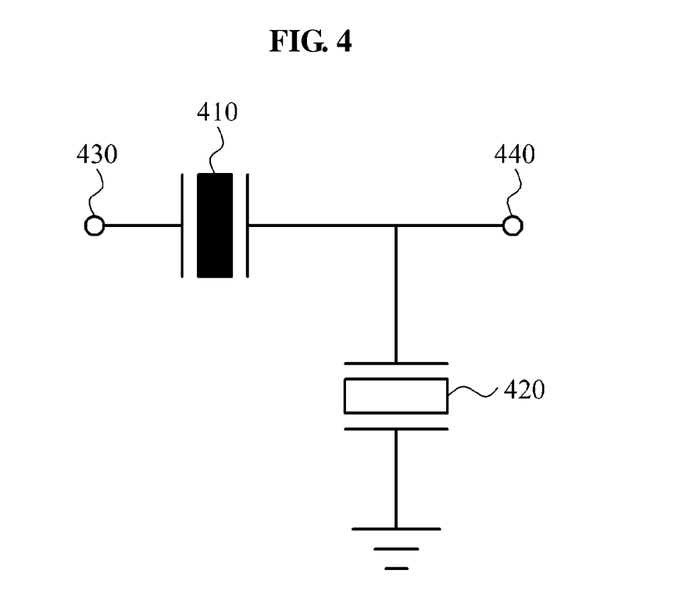
FIG. 4 through FIG. 13 are diagrams illustrating examples of an RF filter using a BAWR.

Referring to FIG. 4, the RF filter includes a low TCF BAWR 410 connected in series to a first port 430 and a second port 440. The RF filter further includes a high Q BAWR 420 connected in parallel to the first port 430 and the second port 440. The first port 430 and the second port 440 may be used as an input end and an output end, respectively, of the RF filter, or vice versa. That is, the first port 430 and the second port 440 may receive an RF signal and output the RF signal filtered by the low TCF BAWR 410 and the high Q BAWR 420, respectively, or vice versa.

Figure 5:
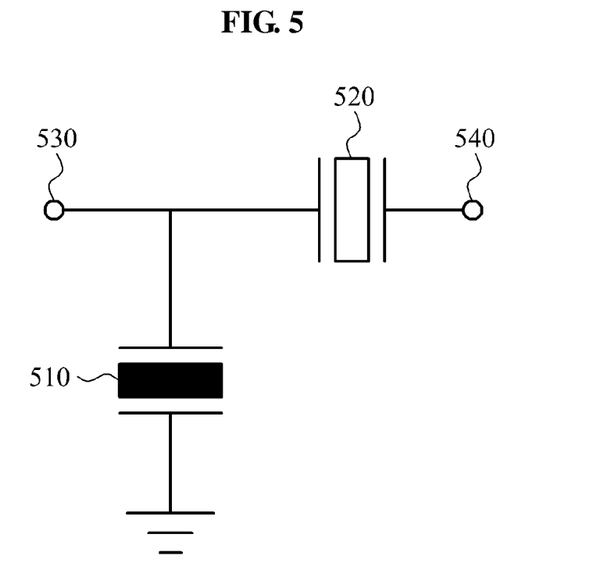

Referring to FIG. 5, the RF filter includes a low TCF BAWR 510 connected in parallel to a first port 530 and a second port 540. The RF filter further includes a high Q BAWR 520 connected in series to the first port 530 and the second port 540.

Figure 6:
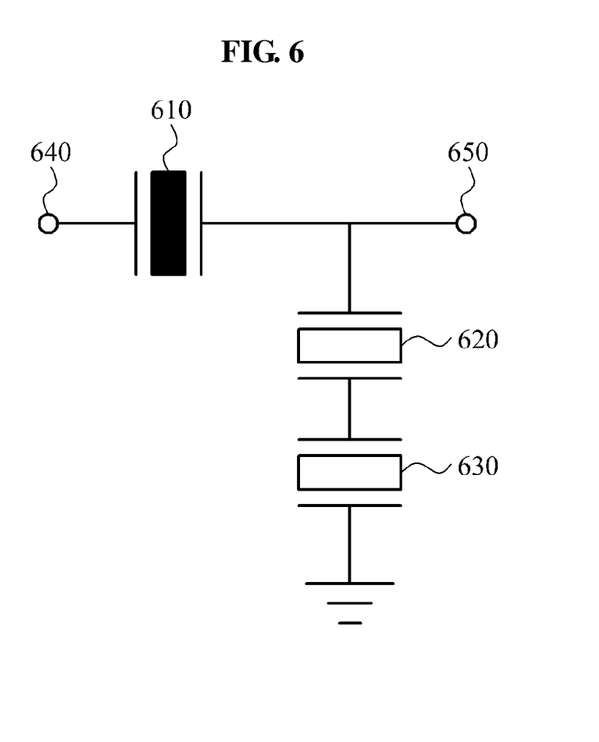

Referring to FIG. 6, the RF filter includes a low TCF BAWR 610 connected in series to a first port 640 and a second port 650. The RF filter further includes a high Q BAWR 620 and a high Q BAWR 630 connected in parallel to the first port 640 and the second port 650. The high Q BAWR 620 and the high Q BAWR 630 are connected to each other in series.

Figure 7:
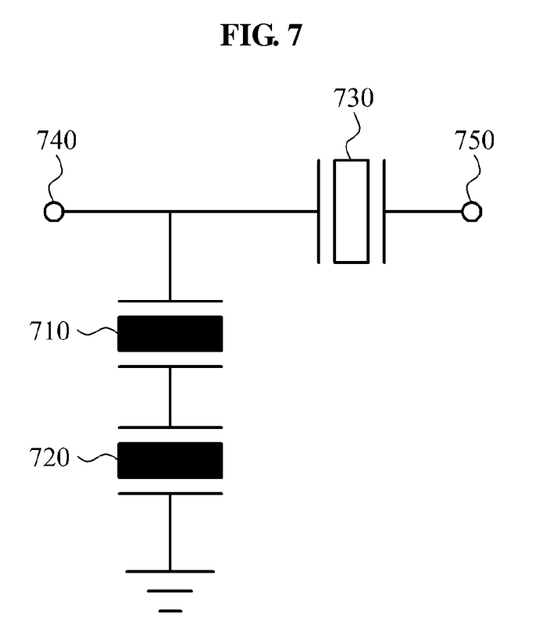

Referring to FIG. 7, the RF filter includes a low TCF BAWR 710 and a low TCF BAWR 720 connected in parallel to a first port 740 and a second port 750. The low TCF BAWR 710 and the low TCF BAWR 720 are connected to each other in series. The RF filter further includes high Q BAWR 730 connected in series to the first port 740 and the second port 750.

Figure 8:
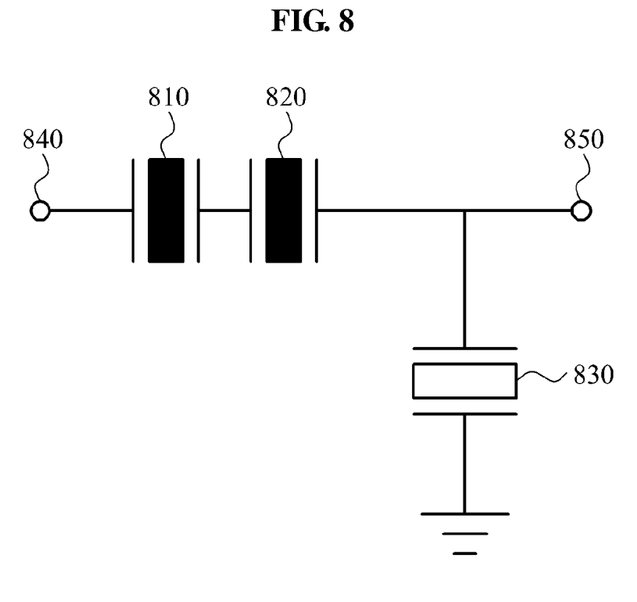

Referring to FIG. 8, the RF filter includes a low TCF BAWR 810 and a low TCF BAWR 820 connected in series to a first port 840 and a second port 850. The low TCF BAWR 810 and the low TCF BAWR 820 are connected to each other in series. The RF filter further includes a high Q BAWR 830 connected in parallel to the first port 840 and the second port 850.

Figure 9:
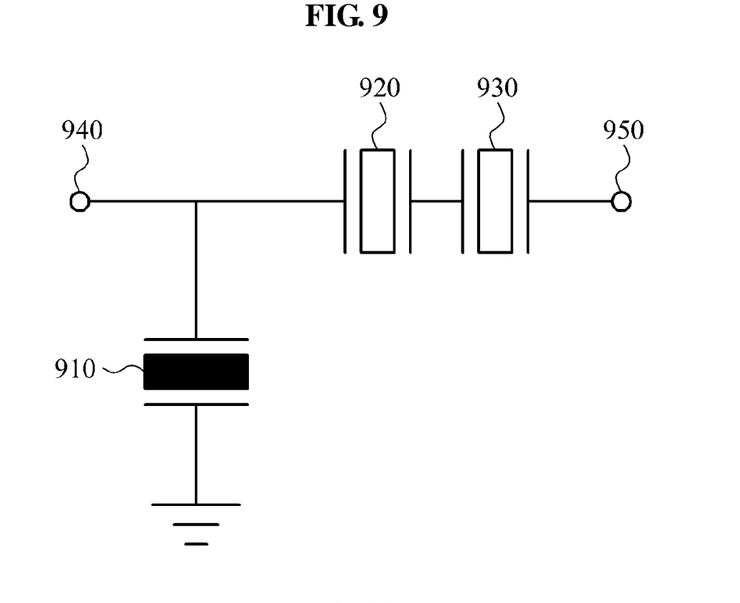

Referring to FIG. 9, the RF filter includes a low TCF BAWR 910 connected in parallel to a first port 940 and a second port 950. The RF filter further includes a high Q BAWR 920 and a high Q BAWR 930 connected in series to the first port 940 and the second port 950. The high Q BAWR 920 and the high Q BAWR 930 are connected to each other in series.

Figure 10:
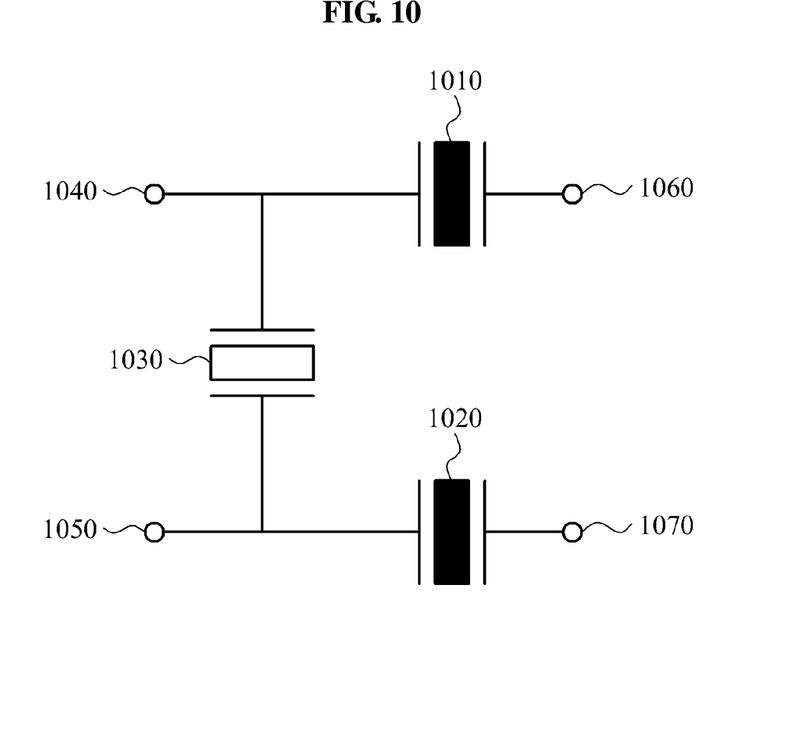

Referring to FIG. 10, the RF filter includes a low TCF BAWR 1010, a low TCF BAWR 1020, and a high Q BAWR 1030 that are formed in a ladder structure. An end of the low TCF BAWR 1010 is connected to a first port 1040 and an end of the high Q BAWR 1030, and another end of the low TCF BAWR 1010 is connected to a third port 1060. An end of the low TCF BAWR 1020 is connected to a second port 1050 and another end of the high Q BAWR 1030, and another end of the low TCF BAWR 1020 is connected to a fourth port 1070. The first port 1040 and the second port 1050 may be used as input ends of the RF filter, the third port 1060 and the fourth port 1070 may be used as output ends of the RF filter, or vice versa.

Figure 11:
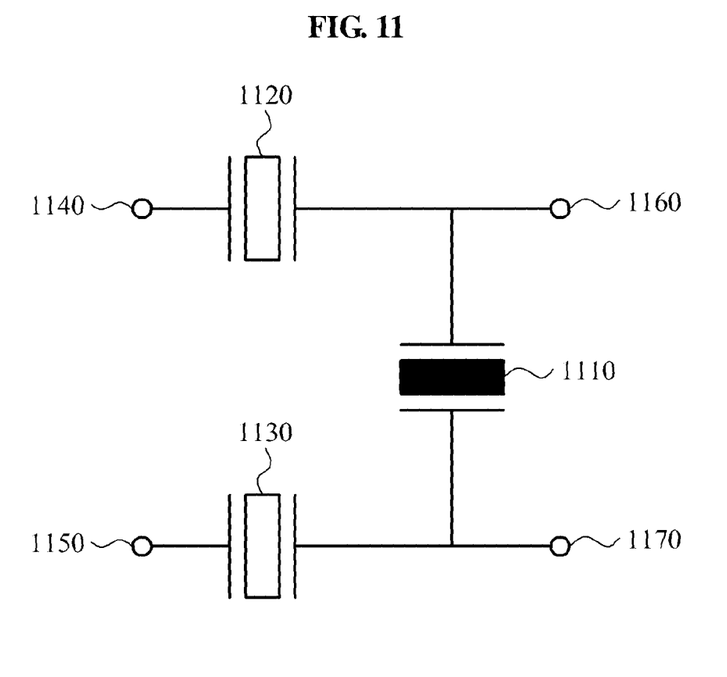

Referring to FIG. 11, the RF filter includes a low TCF BAWR 1110, a high Q BAWR 1120, and a high Q BAWR 1130. An end of the low TCF BAWR 1110 is connected to a third port 1160 and an end of a high Q BAWR 1120. Another end of the high Q BAWR 1120 is connected to a first port 1140. Another end of the low TCF BAWR 1110 is connected to a fourth port 1170 and an end of the high Q BAWR 1130. Another end of the high Q BAWR 1130 is connected to a second port 1150.

Figure 12:
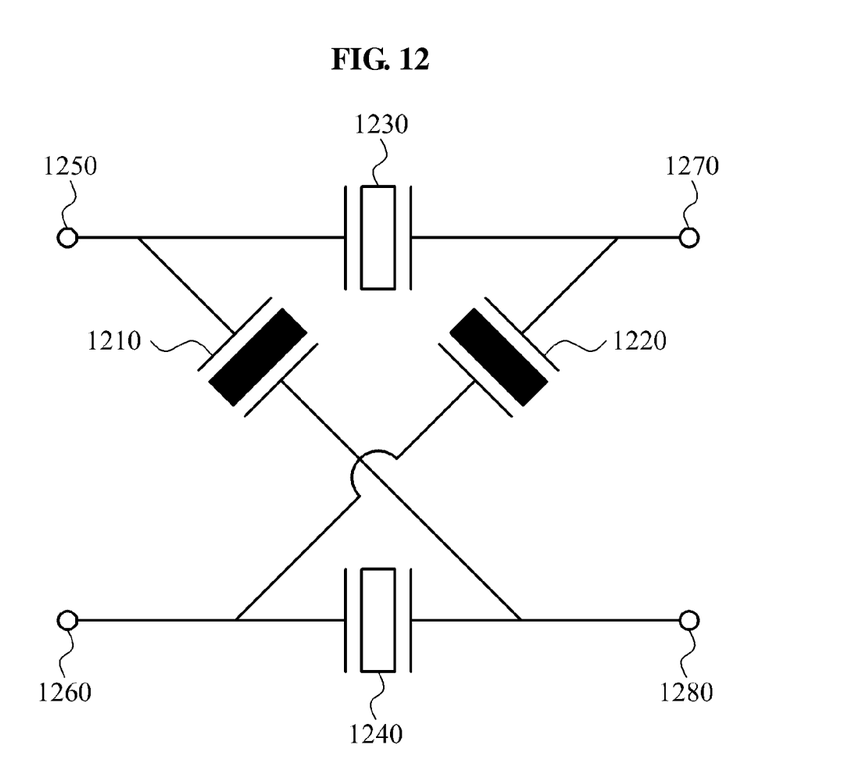

Referring to FIG. 12, the RF filter includes a low TCF BAWR 1210, a low TCF BAWR 1220, a high Q BAWR 1230, and a high Q BAWR 1240 that are formed in a bridge structure. An end of the low TCF BAWR 1210 is connected to a first port 1250 and an end of the high Q BAWR 1230, and another end of the low TCF BAWR 1210 is connected to a fourth port 1280 and an end of the high Q BAWR 1240. An end of the low TCF BAWR 1220 is connected to a second port 1260 and another end of the high Q BAWR 1240, and another end of the low TCF BAWR 1220 is connected to a third port 1270 and another end of the high Q BAWR 1230.

Figure 13:
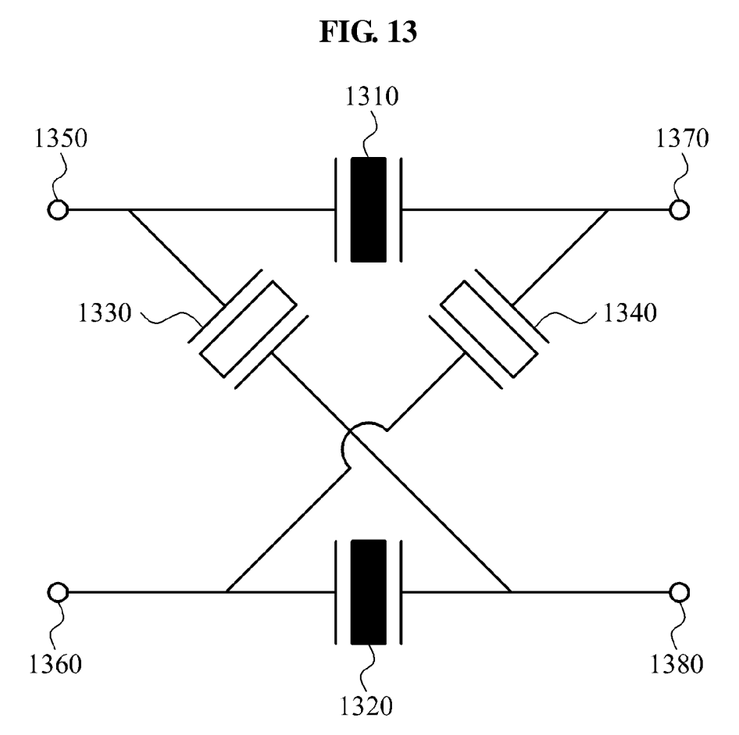

Referring to FIG. 13, the RF filter includes a low TCF BAWR 1310, a low TCF BAWR 1320, a high Q BAWR 1330, and a high Q BAWR 1340 that are formed in a bridge structure. An end of a low TCF BAWR 1310 is connected to a first port 1350 and an end of a high Q BAWR 1330. Another end of the low TCF BAWR 1310 is connected to a third port 1370 and an end of a high Q BAWR 1340. An end of the low TCF BAWR 1320 is connected to a second port 1360 and another end of the high Q BAWR 1340. Another end of the low TCF BAWR 1320 is connected to a fourth port 1380 and another end of the high Q BAWR 1330.

Figure 14:
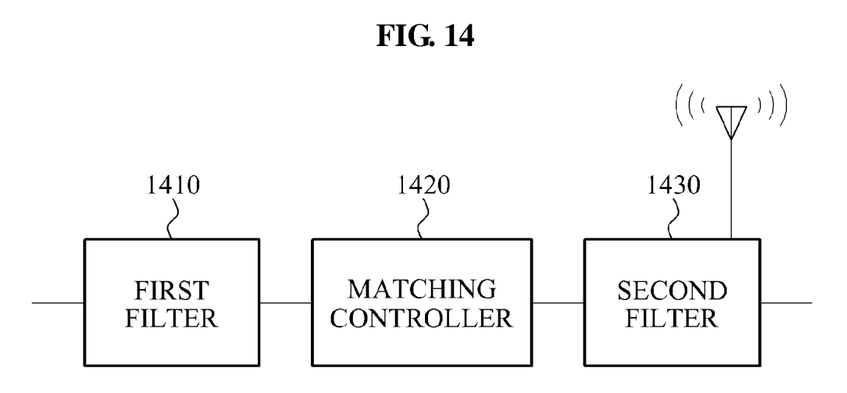
FIG. 14 is a block diagram illustrating an example of an RF transceiver using a BAWR.

FIG. 14 is a block diagram illustrating an example of an RF transceiver using a BAWR. Referring to FIG. 14, the RF transceiver includes a first filter 1410, a matching controller 1420, and a second filter 1430.

The first filter 1410 filters a signal to be transmitted in a transmission frequency band. The first filter 1410 may transfer the filtered signal to an antenna to be transmitted to an outside of the RF transceiver, e.g., a terminal.

The second filter 1430 filters a signal received in a reception frequency band. The second filter 1430 may receive the received signal from the antenna that receives the signal from the outside of the RF transceiver, e.g., the terminal.

The matching controller 1420 controls impedance matching between the first filter 1410 and the second filter 1430 to prevent interference between the signal filtered by the first filter 1410 and the signal filtered by the second filter 1430. For example, to prevent the interference, the matching controller 1420 may change (e.g., match) a phase of the signal filtered by the first filter 1410 and a phase of the signal filtered by the second filter 1430.

The first filter 1410 and the second filter 1430 may operate at different predetermined resonant frequencies, respectively. Each of the first filter 1410 and the second filter 1430 may include at least one BAWR including a low TCF compared to another BAWR, and at least one BAWR including a high quality factor compared to the at least one BAWR including the low TCF. For example, each of the first filter 1410 and the second filter 1430 may include any of the circuit structures shown in FIG. 4 through FIG. 13.

According to the teachings above, there is provided a BAWR including a TCF that becomes close to zero, using a TCF compensation layer. Accordingly, a device including the BAWR may operate in a narrow band gap between a transmission frequency band and a reception frequency band. Additionally, by employing a BAWR including a high quality factor in addition to the BAWR including the compensated TCF, in the device, it is possible to decrease an insertion loss of a pass band of the device. Furthermore, by employing the BAWR including the high quality factor in addition to the BAWR including the compensated TCF, in the device, it is possible to secure a high attenuation and low insertion loss characteristic in the device.

The units described herein may be implemented using hardware components and software components. For example, the hardware components may include microphones, amplifiers, band-pass filters, audio to digital convertors, and processing devices. A processing device may be implemented using one or more general-purpose or special purpose computers, such as, for example, a processor, a controller and an arithmetic logic unit, a digital signal processor, a microcomputer, a field programmable array, a programmable logic unit, a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciated that a processing device may include multiple processing elements and multiple types of processing elements. For example, a processing device may include multiple processors or a processor and a controller. In addition, different processing configurations are possible, such a parallel processors.

The software may include a computer program, a piece of code, an instruction, or some combination thereof, to independently or collectively instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network coupled computer systems so that the software is stored and executed in a distributed fashion. The software and data may be stored by one or more computer readable recording mediums. The computer readable recording medium may include any data storage device that can store data which can be thereafter read by a computer system or processing device. Examples of the non-transitory computer readable recording medium include read-only memory (ROM), random-access memory (RAM), CD-ROMs, magnetic tapes, floppy disks, optical data storage devices. Also, functional programs, codes, and code segments that accomplish the examples disclosed herein can be easily construed by programmers skilled in the art to which the examples pertain based on and using the flow diagrams and block diagrams of the figures and their corresponding descriptions as provided herein.

As a non-exhaustive illustration only, a terminal and a device described herein may refer to mobile devices such as a cellular phone, a personal digital assistant (PDA), a digital camera, a portable game console, and an MP3 player, a portable/personal multimedia player (PMP), a handheld e-book, a portable laptop PC, a global positioning system (GPS) navigation, a tablet, a sensor, and devices such as a desktop PC, a high definition television (HDTV), an optical disc player, a setup box, a home appliance, and the like that are capable of wireless communication or network communication consistent with that which is disclosed herein.

A number of examples have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A radio frequency (RF) filter using a bulk acoustic wave resonator (BAWR), the RF filter comprising:
   at least one low temperature coefficient of frequency (TCF) BAWR comprising
      a first electrode,
      a first piezoelectric layer disposed on the first electrode,
      a second electrode disposed on the list piezoelectric layer, and
      a TCF compensation layer configured to compensate for a TCF of the first electrode, the first piezoelectric layer and the second electrode; and
   at least one high quality factor (Q) BAWR comprising
      a third electrode,
      a second piezoelectric layer disposed on the third electrode, and
      a fourth electrode disposed on the second piezoelectric layer,
   wherein the at least one high Q BAWR comprises a high Q compared to the at least one low TCF BAWR and does not include a TCF compensation layer configured to compensate for a TCG of the third electrode, the second piezoelectric layer, and the fourth electrode, and
   wherein the at least one low TCF BAWR comprises a low TCF compared to the at least one high Q BAWR.

2. The RF filter of claim 1, wherein each of the at least one low TCF BAWR comprises a first air cavity disposed above a first substrate, wherein the first electrode is disposed on the air cavity, and wherein the TCF compensation layer of the at least one low TCF BAWR is disposed on or below the first piezoelectric layer.

3. The RF filter of claim 2, wherein the TCF compensation layer of the at east one low TCF BAWR comprises a silicon oxide-based material or a silicon nitride-based material.

4. The RF filter of claim 2, wherein the TCF compensation layer is doped with an impurity element.

5. The RF filter of claim 4, wherein the impurity element comprises arsenic (As), or antimony (Sb), or phosphorus (P), or boron (B), or germanium (Ge), or silicon (Si), or aluminum (Al), or any combination thereof.

6. The RF filter of claim 2, wherein the TCF compensation layer comprises a positive value of a TCF.

7. The RF filter of claim 1, wherein each of the at least one low TCF BAWR comprises a first air cavity disposed above a first substrate, where the first electrode is disposed on the air cavity, and wherein the TCF compensation layer of the at least one low TCF BAWR is disposed on and below the piezoelectric layer.

8. The RF filter of claim 1, further comprising:
an input end configured to receive an RF signal; and
an output end configured to output the RF signal filtered by the at least one low TCF BAWR and the at least one high Q BAWR,
wherein the at least one low TCF BAWR is connected in series to the input end and the output end, and
wherein the at least one high Q BAWR is connected in parallel to the input end and the output end.

9. The RF filter of claim 1, further comprising:
an input end configured to receive an RF signal; and
an output end configured to output the RF signal filtered by the at least one low TCF BAWR and the at least one high Q BAWR,
wherein the at least one low TCF BAWR is connected in parallel to the input end and the output end, and
wherein the at least one high Q BAWR is connected in series to the input end and the output end.

10. The RF filter of claim 1, wherein:
the at least one low TCF BAWR comprises a first low TCF BAWR and a second low TCF BAWR; and
the first low TCF BAWR, the second low TCF BAWR, and the at least one high Q BAWR are connected to each other in a ladder structure.

11. The RF filter of claim 10, further comprising:
a first port;
a second port;
a third port; and
a fourth port,
wherein an end of the first low TCF BAWR is connected to the first port and an end of the at least one high Q BAWR,
wherein another end of the first low TCF BAWR is connected to the third port,
wherein an end of the second low TCF BAWR is connected to the second port and another end of the at least one high Q BAWR, and
wherein another end of the second low TCF BAWR is connected to the fourth port.

12. The RF filter of claim 1, wherein:
the at least one high Q BAWR comprises a first high Q BAWR and a second high Q BAWR; and
the first high Q BAWR, the second high Q BAWR, and the at least one low TCF BAWR are connected to each other in a ladder structure.

13. The RF filter of claim 12, further comprising:
a first port;
a second port;
a third port; and
a fourth port,
wherein an end of the first high Q BAWR is connected to the third port and an end of the at least one low TCF BAWR,
wherein another end of the first high Q BAWR is connected to the first port,
wherein an end of the second high Q BAWR is connected to the fourth port and another end of the at least one low TCF BAWR, and
wherein another end of the second high Q BAWR is connected to the second port.

14. The RF filter of claim 1, wherein:
the at least one low TCF BAWR comprises a first low TCF BAWR and a second low TCF BAW R;
the at least one high Q BAWR comprises a first high Q BAWR and a second high Q BAWR; and
the first low TCF BAWR, the second low TCF BAWR, the first high Q BAWR, and the second high Q BAWR are connected to each other in a bridge structure.

15. The RF filter of claim 14, further comprising:
a first port;
a second port;
a third port; and
a fourth port,
wherein an end of the first low TCF BAWR is connected to the first port and an end of the first high Q BAWR,
wherein another end of the first low TCF BAWR is connected to the fourth port and an end of the second high Q BAWR,
wherein an end of the second low TCF BAWR is connected to the second port and another end of the second high Q BAWR, and
wherein another end of the second low TCF BAWR is connected to the third port and another end of the first high Q BAWR.

16. The RF filter of claim 14, further comprising:
a first port;
a second port;
a third port; and
a fourth port,
wherein an end of the first low TCF BAWR is connected to the first port and an end of the first high Q BAWR,
wherein another end of the first low TCF BAWR is connected to the third port and an end of the second high Q BAWR,
wherein an end of the second low TCF BAWR is connected to the second port and another end of the second high Q BAWR, and
wherein another end of the second low TCF BAWR is connected to the fourth port and another end of the first high Q BAWR.

17. A radio frequency (RF) transceiver using a bulk acoustic wave resonator (BAWR), the RF transceiver comprising:
a first filter configured to filter a signal to be transmitted in a transmission frequency band; and
a second filter configured to filter a signal received in a reception frequency band,
wherein the first filter and the second filter are configured to operate at different predetermined resonant frequencies, respectively,
wherein each of the first filter and the second filter comprises at least one low temperature coefficient of frequency (TCF) BAWR, and at least one high quality factor (Q) BAWR comprising a high Q compared to the at least one low TCF BAWR, the at least one low TCF BAWR comprising a low TCF compared to the at least one high Q BAWR,
wherein the at least one low TCF BAWR comprises
a first electrode,
a piezoelectric layer disposed on the first electrode, a second electrode disposed on the first piezoelectric layer, and a TCF compensation layer configured to compensate for a TCF on the first electrode, the first piezoelectric layer and the second electrode, wherein the at least one high Q BAWR comprises a third electrode, a second piezoelectric layer disposed on the third electrode and a fourth electrode disposed on the second piezoelectric layer and wherein the at least one high Q BAWR does not include a TCF compensation layer configured to compensate for a TCF of the third electrode, the second piezoelectric layer, and the fourth electrode.

18. The RF transceiver of claim 17, wherein the first filter is further configured to transfer the filtered signal to an antenna.

19. The RF transceiver of claim 17, wherein the second filter is further configured to receive the received signal from an antenna.

20. The RF transceiver of claim 17, further comprising:

a matching controller configured to control impedance matching between the first filter and the second filter to prevent interference between the signal filtered by the first filter and the signal filtered by the second filter.

* * * * *